United States Patent [19]
Chi

[11] Patent Number: 5,717,237
[45] Date of Patent: Feb. 10, 1998

[54] PN JUNCTION FLOATING GATE EEPROM, FLASH EPROM DEVICE

[75] Inventor: Kao Min Chi, Hsin-Cho, Taiwan

[73] Assignee: Taiwan Semiconductor Manufacturing Company, Ltd., Hsin-Chu, Taiwan

[21] Appl. No.: 665,272

[22] Filed: Jun. 17, 1996

Related U.S. Application Data

[62] Division of Ser. No. 415,420, Apr. 3, 1995, Pat. No. 5,554,552.

[51] Int. Cl.$^6$ .......................... H01L 29/76; H01L 29/788
[52] U.S. Cl. ............................................. 257/315; 257/316
[58] Field of Search ..................................... 257/314–316

[56] References Cited

U.S. PATENT DOCUMENTS

| | | | |
|---|---|---|---|
| 4,745,079 | 5/1988 | Pfiester | 437/29 |
| 5,416,738 | 5/1995 | Shrivastava | 365/185 |
| 5,469,383 | 11/1995 | McElroy et al. | 257/315 |

Primary Examiner—Wael Fahmy
Assistant Examiner—Howard Weiss
Attorney, Agent, or Firm—George O. Saile; Stephen B. Ackerman; Graham S. Jones, II

[57] ABSTRACT

Multi-state EEPROM and Flash EPROM devices with charge control are formed with a P–N junction floating gate with an N type capacitor on top of the channel area and a P type capacitor on top of the field oxide area. An additional mask and a P+/N+ implant instead of $POCl_3$ doping are required to fabricate this device. The threshold voltage of this device well controlled by the ratio of $C_{fp}$, capacitance of the P type capacitor and $C_{fp}$ capacitance of the N type capacitor. The coupling ratio "READ" and "WRITE" are exactly the same as current N type floating gate. The "ERASE" efficiency is improved by 1.5 volt higher voltage to the drain electrode of the EEPROM or the source electrode of a flash EPROM. Also, a good P–N junction floating gate, with reverse junction leakage less than 10 pA for 7 Volt reverse bias, is required to discharge the N type capacitor without affecting the P type capacitor.

17 Claims, 14 Drawing Sheets

PN JUNCTION FLOATING GATE EEPROM, FLASH EPROM DEVICE

CONTINUING DATA

This application is a Division of U.S. patent application Ser. No. 08/415,420 filed Apr. 3, 1995, now U.S. Pat. No. 5,554,552,

BACKGROUND OF THE INVENTION

1. Field of the Invention

This invention relates to semiconductor memory devices and more particularly to improved design of EEPROM and flash EPROM devices.

2. Description of Related Art

In the present state of the art, the current charge erasing amount can not be well controlled by time due to the complex equation of F-N (Fowler-Nordheim) tunneling on the electric field across the tunneling oxide.

An object of this invention is providing precise multi-state (1 cell, 2 bits) for E2PROM and Flash EPROM devices.

An object of this invention is to improve charge control by a P–N junction which is fabricated by implant floating gate of EEPROM (E2PROM) and Flash EPROM.

In accordance with this invention, a floating gate ROM device comprises a lightly doped P– semi-conductor substrate, a doped source region and a doped drain region formed in the substrate, a tunnel oxide layer and field oxide regions formed over the surface of the substrate, a PN junction floating gate electrode comprising doped polysilicon with an N doped region above the tunnel oxide layer and at least one P doped region above a field oxide region juxtaposed with the N doped region to form a PN junction. An integrate electrode dielectric layer covers the PN floating gate electrode. A polysilicon control gate electrode is formed over the integrate electrode dielectric layer, with an additional dielectric layer over the control gate electrode.

Preferably, the PN junction comprises a first polysilicon layer formed over the tunnel oxide layer and the field oxide regions, and a P-type capacitor comprising an ion implanted region in the first polysilicon layer over the field oxide regions forming an N-type capacitor implant into portions of the first polysilicon layer over the tunnel oxide regions.

In accordance with another aspect of this invention, a floating gate ROM device comprises a lightly doped P– semiconductor substrate, a doped source region and a doped drain region formed in the substrate, a tunnel oxide layer and field oxide regions formed over the surface of the substrate, a PN junction floating gate electrode comprising doped polysilicon with an N doped region above the tunnel oxide layer and at least one P doped region above the field oxide region juxtaposed with the N doped region to form a PN junction, an interpolysilicon ONO dielectric layer covering the PN floating gate electrode, a polysilicon control gate electrode formed over the ONO dielectric layer, an additional dielectric layer over the control gate electrode with a via opening down to the drain region; and an electrical conductor over the additional dielectric layer extending down into the via opening into contact with the drain region.

Preferably, there is a control gate voltage $V_g$ applied to a first node $N_1$ connected to the control electrode, the first node connected through a capacitor $C_{fn}$ N type floating gate capacitor to a second node $N_2$ comprising the N+ region of the floating gate electrode which is connected through the capacitor $C_{gd}$ for coupling the floating gate drain region to the drain region, the drain region being connected to the applied drain region voltage $V_d$, the node $N_2$ being connected through capacitor $C_{gb}$ between the substrate and the floating gate capacitor to $V_b$ applied substrate voltage and through capacitor $C_{gs}$ between the source and the floating gate to $V_s$ applied source voltage, the node $N_1$ being connected through capacitor $C_{fp}$ comprising a P type floating gate capacitance to a node $N_3$, the node $N_3$ being connected to the node $N_2$ through a PN diode formed in the floating gate and node $N_3$ is also connected to node $N_2$ through a capacitor $C_j$.

BRIEF DESCRIPTION OF THE DRAWINGS

The foregoing and other aspects and advantages of this invention are explained and described below with reference to the accompanying drawings, in which.

DESCRIPTION OF THE PREFERRED EMBODIMENT

Figure 1A:
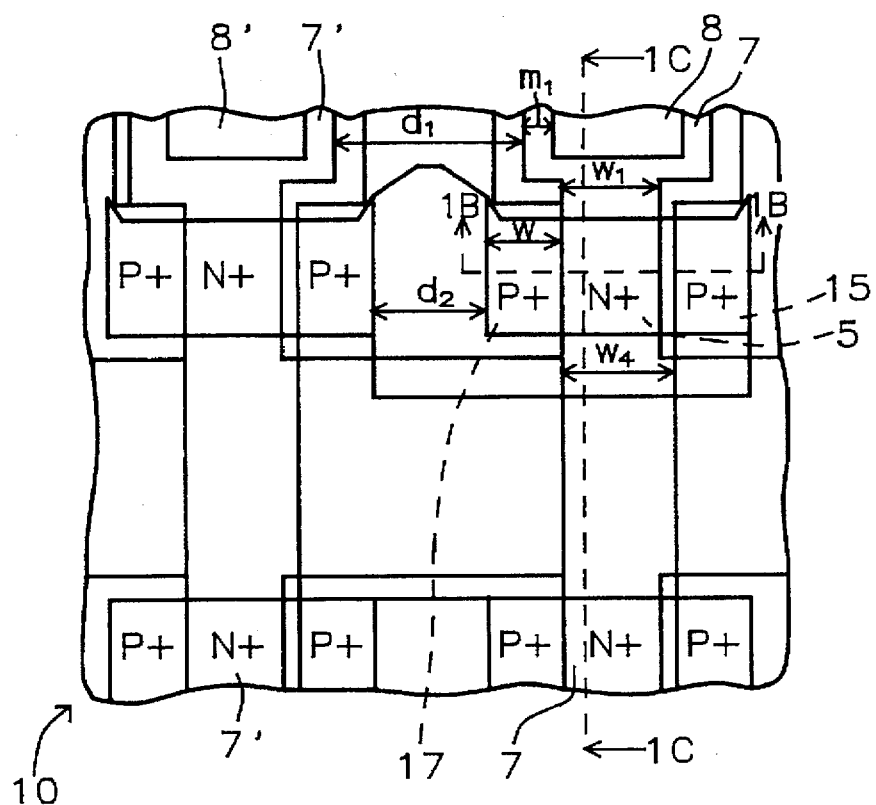
FIG. 1A shows a plan view of a EPROM semiconductor memory device in accordance with this invention formed on a P– doped substrate carrying an array of EPROM cells.

This invention improves charge control by a P–N junction which is fabricated by implanting a floating gate of EEPROM (E2PROM) and Flash EPROM devices. Based upon an analysis, the $\delta V_t \text{shift} = Q/C_{fg}$, where:

Q=charge stored in the floating gate $C_{fg}$=total capacitance between floating gate and control gate (second polysilicon layer).

In this new device (as explained in detail below referring to FIG. 2) the $C_{fg}$ is divided into two capacitors $C_{fgp}$ and $C_{fgp}$ separated by a PN junction, diode D. The $C_{fgp}$ is formed on a field oxide region (region 43 in FIG. 1B and $C_{fgn}$ covers the active channel 11.)

Device operation:

$$\delta V_t = \frac{Q}{C_{fgn} + C_{fgp}}$$

After first Erase:

$$\delta V_t = \frac{C_{fgp}}{(C_{fgn} + C_{fgp})^2} Q$$

Main point:
1. A PN junction floating gate with an N type 1 capacitor on top of channel area and a P type capacitor on top of field oxide.
2. Process is fully compatible to current process.

Problem Solved:

1. A four state cell can be obtained by Erase times control rather than time control where as follows:

Erase times =erase number 1, 2, 3, . . . .

Time =erase pulse period 1 μs, 2 μs, 3 μs, . . . 10 μs . . . 1 ms.

2. The precise voltage shift can be well controlled by the area ratio of N type to P type floating gate.

READ MODE

Once the positive gate control voltage Vg is applied, the PN junction is forward biased to change the P type floating gate to the same potential as the N type floating conductor gate in several ns (nanoseconds) based on the assumption of a forward bias current greater than about 1 μA.

PROGRAM MODE

FLASH EPROM:

Hot electron injection from applied drain voltage Vd to the floating gate voltage $V_{fg}$ at the N type capacitor is the mechanism for programming. The efficiency is strongly related to GCR (Gate Coupling Ratio), and DCR (Drain Coupling Ratio.) During the programming, the injected electron charge can be well distributed on the N type and P type floating gate electrodes.

The PROGRAM performance is exactly the same as for conventional EPROM and FLASH EPROM devices.

$$GCR = \frac{(C_{fp} + C_{fn})}{C_{gb} + C_{gd} + C_{gs} + C_{fp} + C_{fn}}$$

EEPROM:

F-N electron tunneling is the mechanism for programming. The efficiency is strongly related to GCR also. During the programming, the PN junction is always at forward bias in a manner similar to the FLASH EPROM operation.

$$GCR = \frac{(C_{fp} + C_{fn})}{C_{gb} + C_{gd} + C_{gs} + C_{fp} + C_{fn}}$$

where $C_{gd}$ is the tunnel oxide capacitor.

$V_g$=12 Volts $V_d$=0 Volts

ERASE MODE

FLASH EPROM:

F-N electron tunneling through source is the mechanism used to perform the Erase function. Erasing from the source side erasing can be performed by application of a high value of an applied source voltage $V_s$ or a negative value of applied control gate voltage $V_g$ with a smaller applied source voltage $V_s$ to relax the overhead of the source junction breakdown.

$V_d$=$V_b$=0 Volts $V_d$ is floating

F-N tunneling efficiency is dependent on E-field across the tunneling oxide. The efficiency is slightly degraded due to the isolated P type capacitor and the isolated N type capacitor.

The source voltage will be coupled into an N type floating gate.

$$V = \frac{C_{gs} * V_s}{C_{gs} + C_{gb} + C_{fn}}$$

Erasing efficiency is proportional to $V_s$-V.

$$V_s - V = \frac{(C_{gb} + C_{fn}) * V_s}{C_{gs} + C_{gb} + C_{fn}}$$

EEPROM:

F-N electron tunneling through the drain is the mechanism for the Erase function.

$V_g$=$V_b$=0 Volt $V_s$ is floating

Drain voltage will be coupled into an N type floating gate.

$$V = \frac{C_{gd} * V_d}{C_{gd} + C_{gb} + C_{fn}}$$

Erasing efficiency is proportional to $V_d$-V.

$$V_d - V = \frac{(C_{gb} + C_{fn}) * V_d}{C_{gd} + C_{gb} + C_{fn}}$$

FIG. 1A Shows a plan view of a EPROM semiconductor memory device 10 in accordance with this invention formed on a P– doped substrate 11 on which an array of EPROM cells are formed. Focussing on one portion of the array, a polysilicon, triple region PNP doped floating gate electrode is shown. The floating gate formed of polysilicon includes three regions. The regions are P+ doped region 17, N+ doped region 5 and P+ doped region 15. A plurality of metallic conductor lines 7, 7' extend from top to bottom in parallel over the surface of device 10, spaced apart by distance $d_1$ with corresponding contact regions 8, 8' for connecting the conductor lines 7, 7' adjacent to the PNP floating gates to drain regions 4 in the device 10 (as shown in FIG. 1C.) Floating gate PNP electrodes are spaced apart by the distance $d_2$ at the contact regions and a greater spacing elsewhere. The width of the conductor lines 7, 7' is $w_1$ with an extra margin of width of $m_1$ about the periphery of contact regions 8.

Figure 1B:
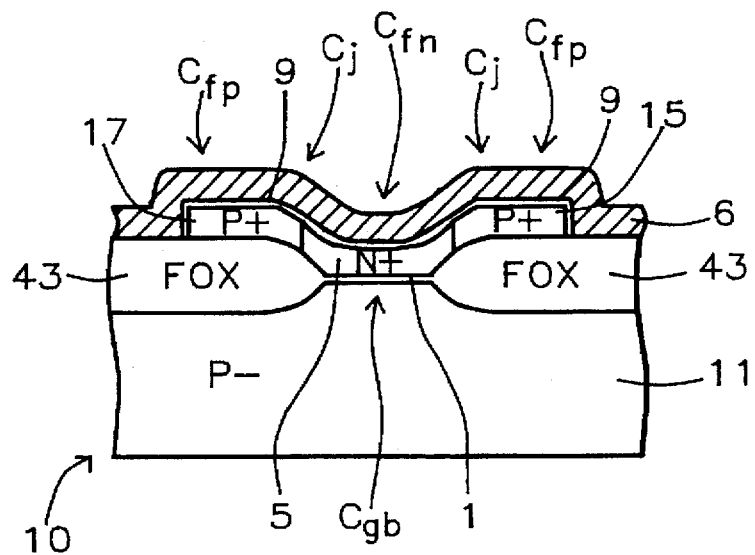
FIG. 1B is a sectional view of the device taken along line, 1B—1B in FIG. 1A showing a polysilicon layer formed of three regions PNP floating gate electrode (a P+ doped region, an N+ doped region and a P+ doped region formed above a tunnel oxide (gate oxide) layer and FOX regions over a semi-conductor substrate.
Figure 1C:
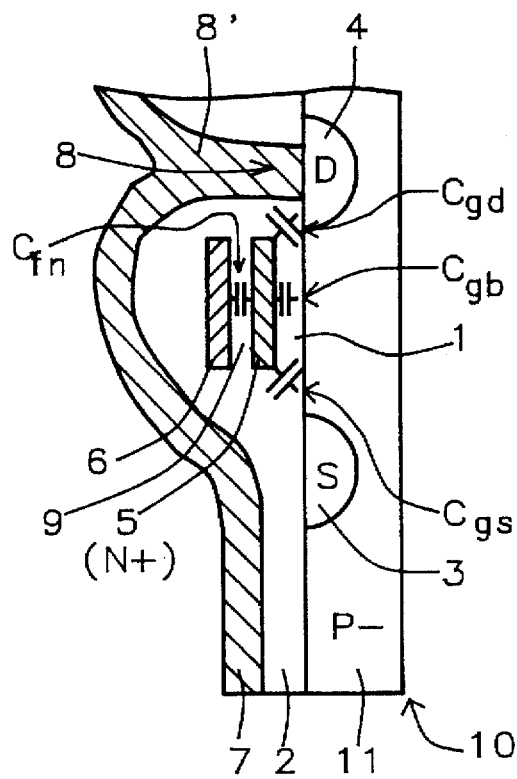
FIG. 1C is a sectional view of device 10 taken along line 1C—1C in FIG. 1A crossing across the floating gate and control gate electrodes of the EPROM device with doped source and drain regions formed in the device substrate.

FIG. 1B is a sectional view of the device 10 taken along line 1B—1B in FIG. 1A. Over the surface of the P– doped substrate 11 of device 10 is a tunnel oxide (gate oxide) layer i with the field oxide (FOX) regions 43 on either end thereof. Formed above tunnel oxide (gate oxide) layer 1 and FOX regions 43 is a polysilicon layer formed of three regions PNP floating gate electrode (a P+ doped region 17, an N+ doped region 5, and a P+ doped region 15.) Thus, on either side of N+ polysilicon region 5 are the P+ polysilicon region 15 and the P+ polysilicon region 17 forming semiconductor PN junctions with region 5 serving as the N electrode of both PN junctions.

Above the PNP floating gate electrode (PNP regions 17, 5 and 15) is a blanket ONO layer 9 which covers the P+ polysilicon region 15, the N+ polysilicon region floating gate electrode 5 and the P+ polysilicon region 17.

Over ONO layer 9 is formed a control gate electrode 6 of the EPROM device 10. Control gate electrode 6 extends across the FOX regions 43, as well, extending across and beyond the P+ polysilicon region 15, the N+ polysilicon region floating gate electrode 5 and the P+ polysilicon region 17.

Above the control gate electrode 6 and the substrate 11 is formed an oxide (silicon dioxide) layer 2 not shown in FIG. 1B for convenience of illustration (see FIG. 1C.) Layer 2 has a preferred composition of a boron-phosphorous $SiO_2$. Oxide layer 2 can be formed by a conventional BPTEOS process starting with BPTEOS.

Referring again to the FOX regions 43 between which the tunnel oxide layer 1 is formed, as stated above, N+ poly silicon region 5 is formed over the tunnel oxide layer 1. Above layer 2 is the conductor line 7, also not shown in FIG. 1B, for convenience of illustration (see FIG. 1C.)

There are capacitors formed which can be seen reference to FIG. 1B. Above the floating gate N+ region 5 is formed a capacitor $C_{fn}$ to the control gate 6. Above the floating gate P+ regions 5 of the floating gate are formed capacitor $C_{fp}$ to the control gate 6 (between regions 15 are formed over field oxide (FOX) regions 43 and control gate 6.) Beneath the N+ floating gate region 5 is formed capacitor $C_{gb}$ between gate region 5 and the (base) substrate 11 (formed over tunnel oxide (gate oxide) layer 1.)

FIG. 1C is a sectional view of device 10 taken along line 1C—1C in FIG. 1A crossing across the floating gate and control gate electrodes of the EPROM device. In the substrate 11 of device 10 are formed doped source region 3 and a doped drain region 4.

Over the surface of the P– doped substrate 11 and source region 3 and drain region 4 of device 10 is a tunnel oxide (gate oxide) layer 1 (with the field oxide (FOX) regions 43 not seen in FIG. 1C.) Formed above tunnel oxide (gate oxide) layer 1 and FOX regions 43 is a polysllicon layer formed of three regions PNP floating gate electrode (a P+ doped region 17, an N+ doped region 5, and a P+ doped region 15.) Thus, on either side of N+ polysilicon region 5 are the P+ polysilicon region 15 and the P+ polysllicon region 17 forming semiconductor PN junctions with region 5 serving as the N electrode of both PN junctions.

Above the control gate layer 6 is the silicon dioxide layer 2 which has an opening 8' therein down to the surface of drain region 4. Formed over the layer 2 is a metallic conductor line 7 extending from the top to the bottom of FIGS. 1A and 1C. Conductor 7 extends down into opening 8' forming a diffusion contact 8 with the drain region 4.

Figure 2:
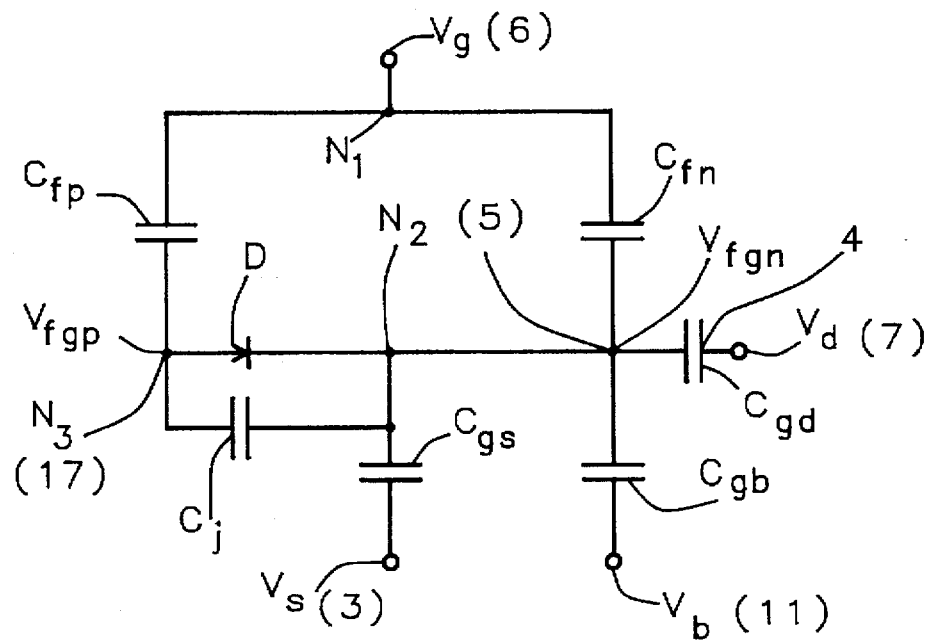
FIG. 2 shows an equivalent circuit of the device of FIGS. 1A–1C showing the applied voltages, various capacitors in the structure and the PN diode in the control gate.

FIG. 2 shows an equivalent circuit of the device of FIGS. 1A–1C showing the applied voltages, various capacitors in the structure and the control gate PN diode. An applied control gate voltage $V_g$ is connected to a node $N_1$ control electrode 6. Node $N_1$ is connected through $C_{fn}$ N type floating gate capacitor) to node $N_2$ (floating gate electrode 5) which is connected through the capacitor $C_{gd}$ (drain to floating gate coupling capacitor) to drain 4 which is in turn connected to the applied drain voltage $V_d$. Node $N_2$ is connected through $C_{gb}$ (substrate to floating gate capacitor) to $V_b$ (applied substrate voltage) and through $C_{gs}$, Source to floating gate coupling capacitor to $V_s$ (applied source voltage.) Node $N_1$ is connected through $C_{fp}$ (P type floating gate capacitance) to node $N_3$. Node $N_3$ is connected to node $N_2$ through PN diode D and node $N_3$ is also connected to node $N_2$ through capacitor $C_j$ (Capacitor of the PN junction.)

Voltages and the capacitors in FIG. 2 are as follows:

$V_g$ Applied control gate voltage
$V_d$ Applied drain voltage
$V_s$ Applied source voltage
$V_b$ Applied substrate voltage
$V_{fgn}$ Floating gate voltage at N type capacitor
$V_{fgp}$ Floating gate voltage at P type capacitor
$C_{fn}$ N type floating gate capacitor between first polysilicon layer N-doped region 5 and second polysilicon layer 6.
$C_{fp}$ P type floating gate capacitance between first polysilicon layer P-doped region 17 and second polysilicon layer 6.
$C_{gd}$ Drain to floating gate coupling capacitance
$C_{gs}$ Source to floating gate coupling capacitance
$C_{gb}$ Substrate to floating gate capacitance $C_j$ Capacitor of the PN junction.

Process Flow for Manufacture of EPROM Device

Figure 3A:
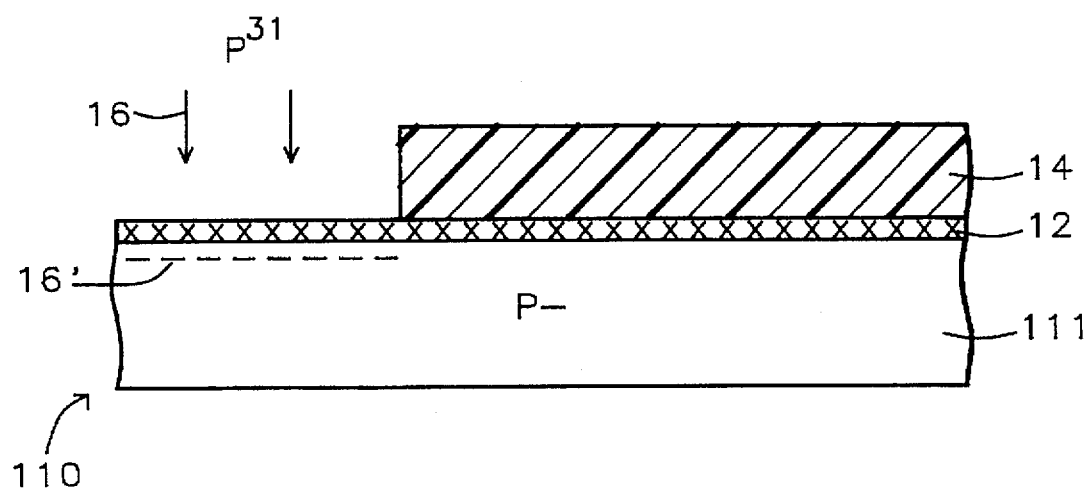
FIGS. 3A–3X show a process flow for an EPROM device.
Figure 3B:
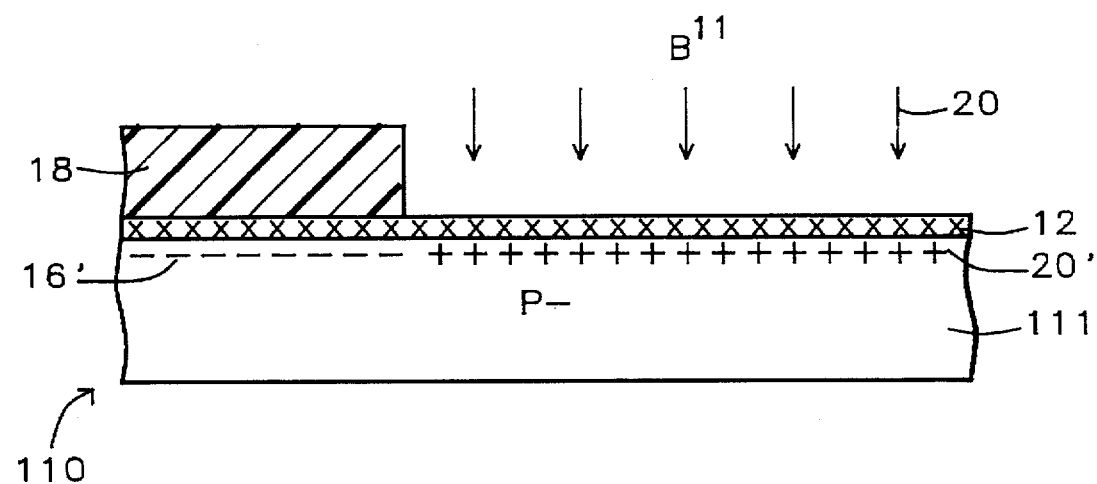
Figure 3C:
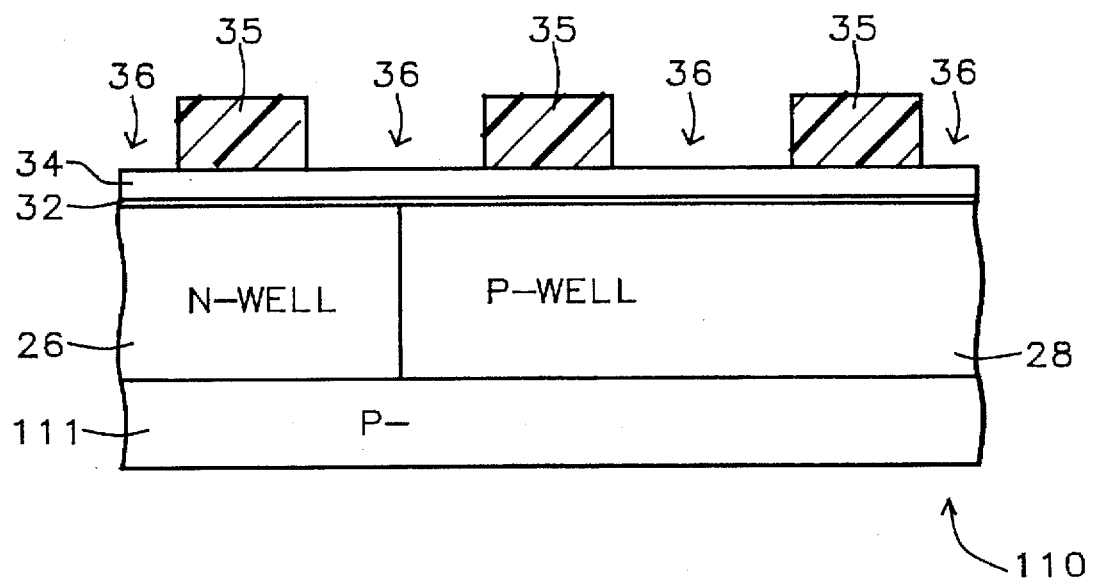
Figure 3D:
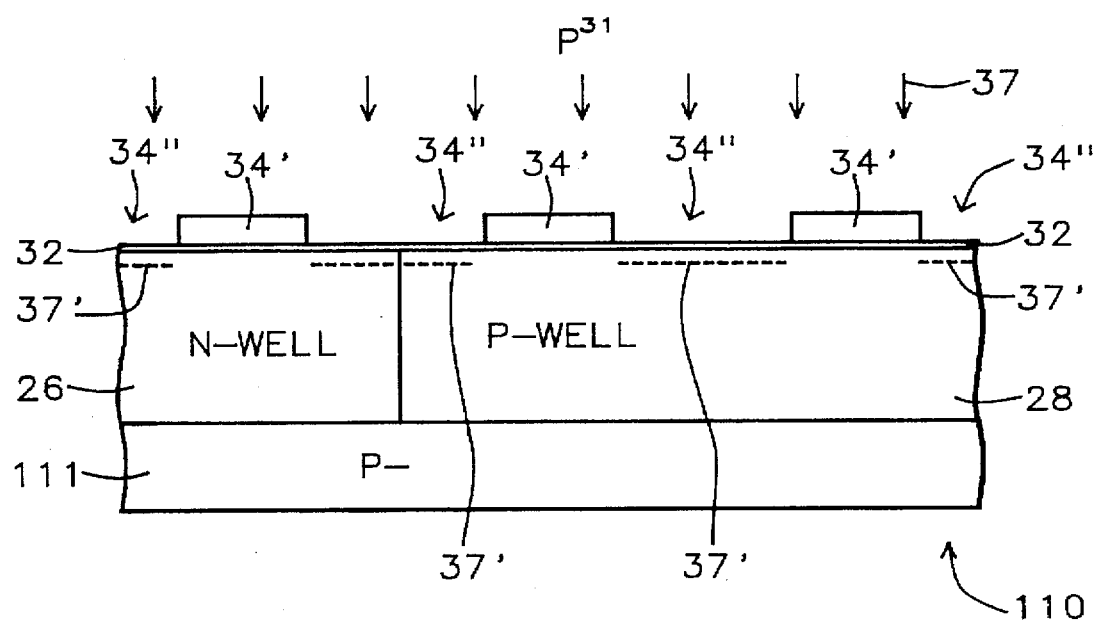
Figure 3E:
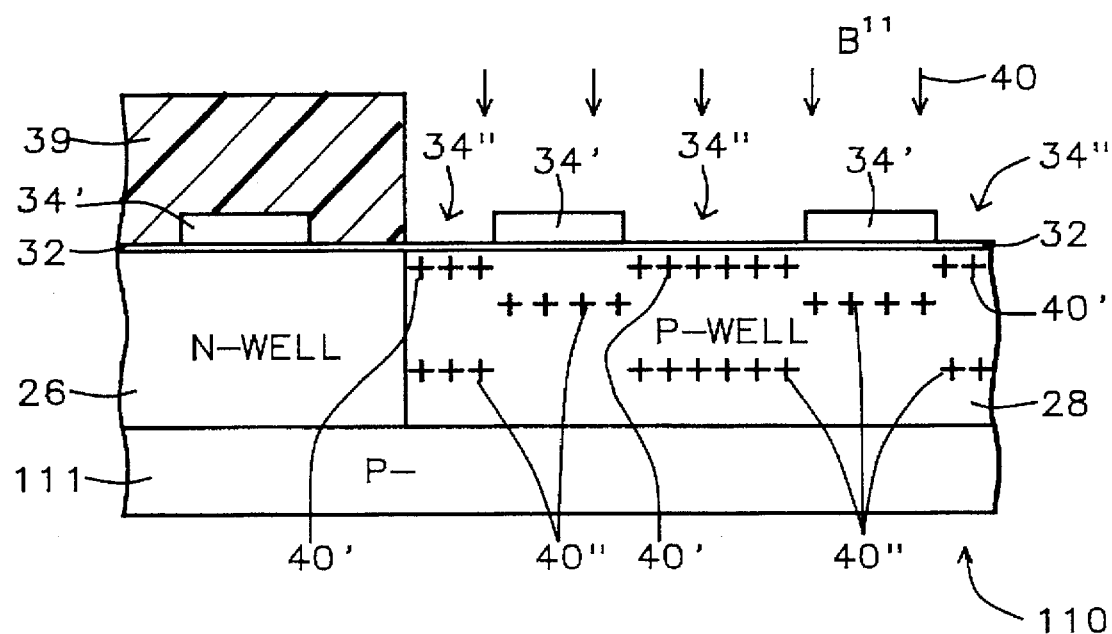
Figure 3F:
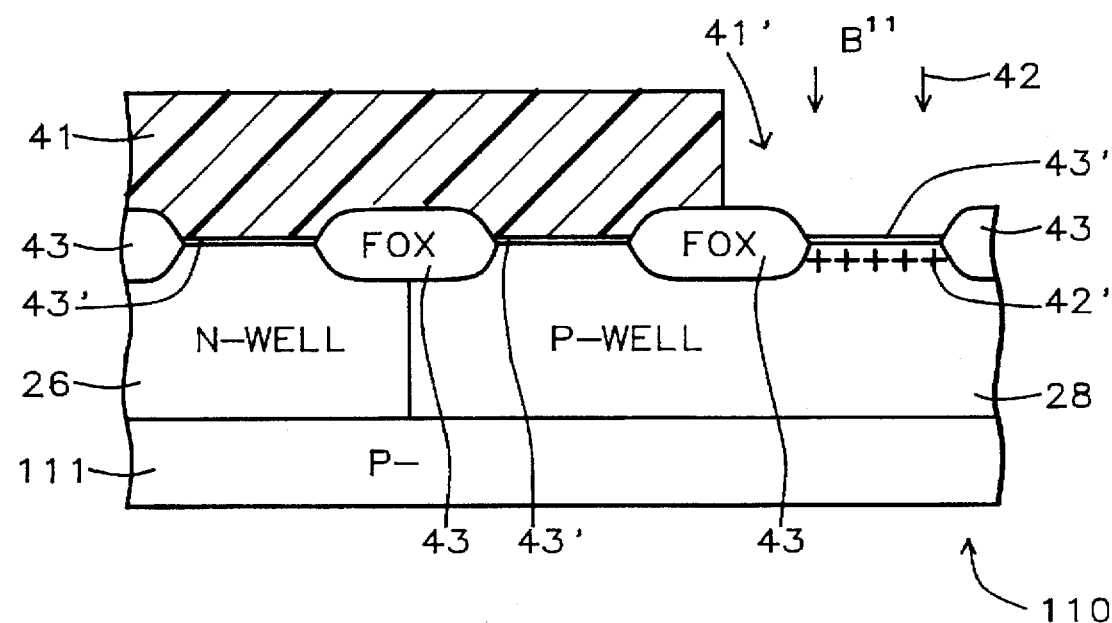
Figure 3G:
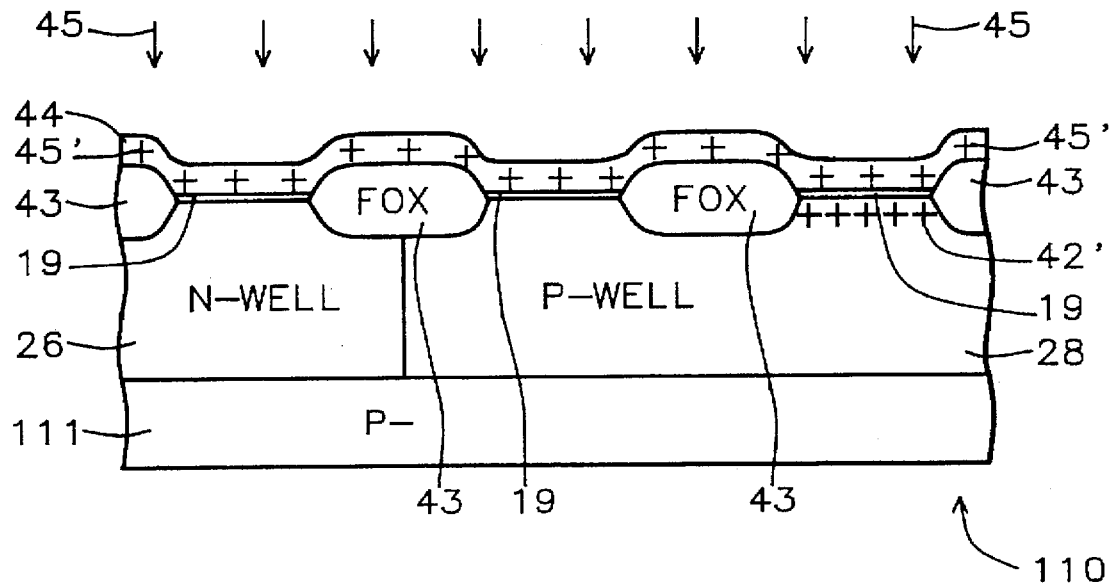
Figure 3H:
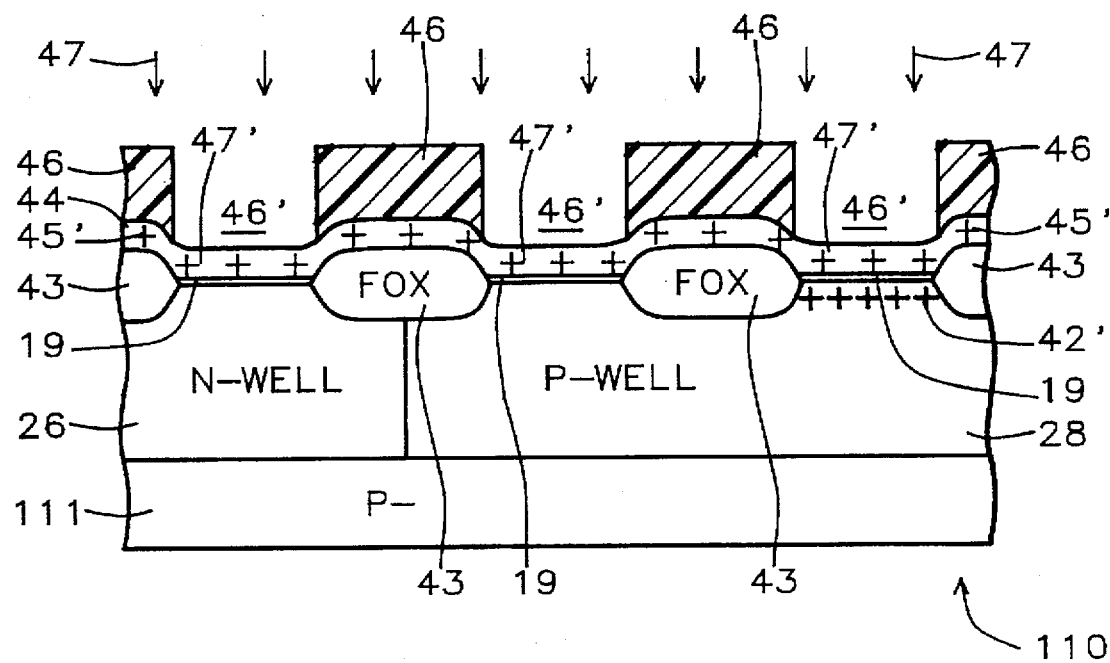
Figure 3I:
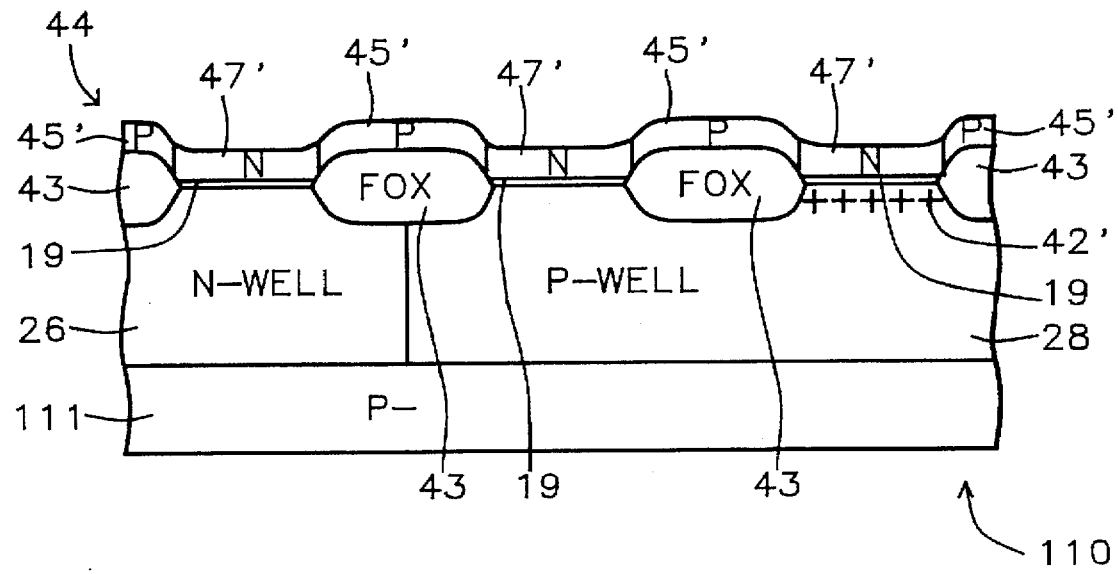
Figure 3J:
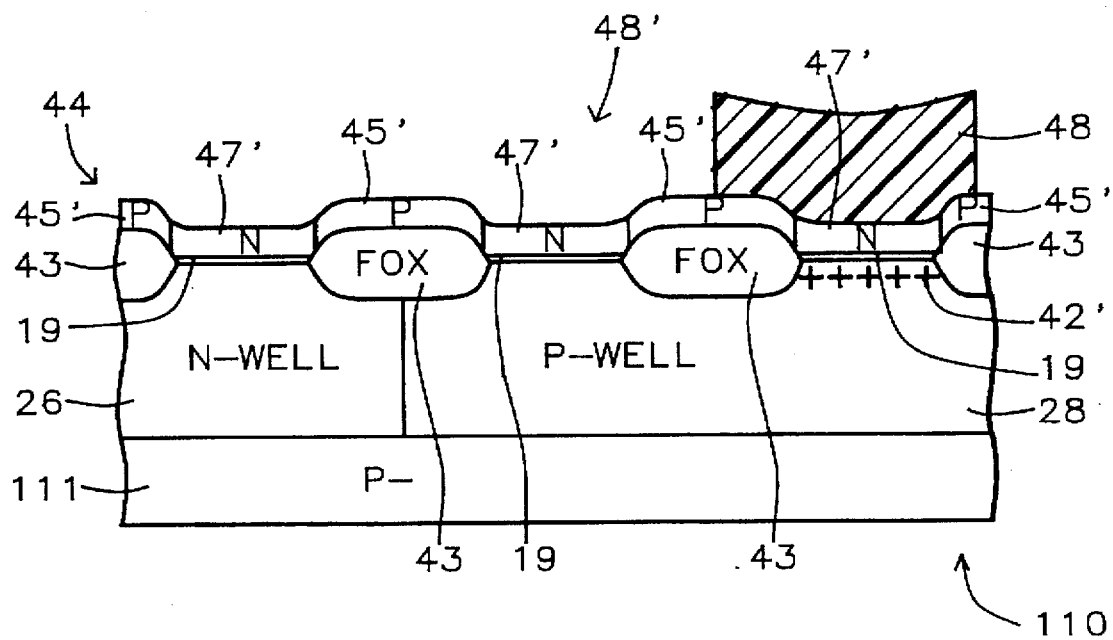
Figure 3K:
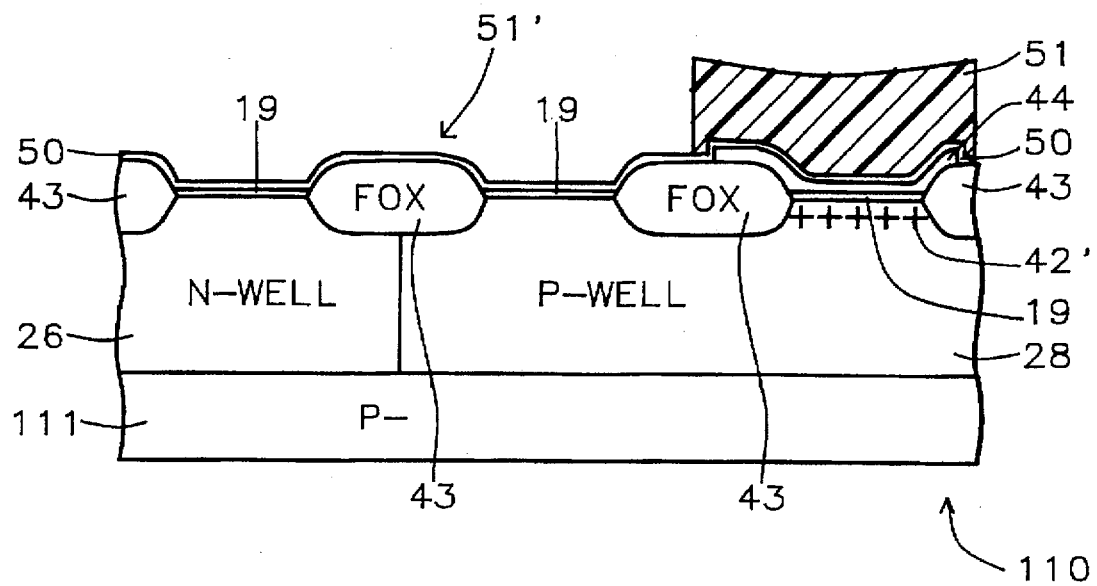
Figure 3L:
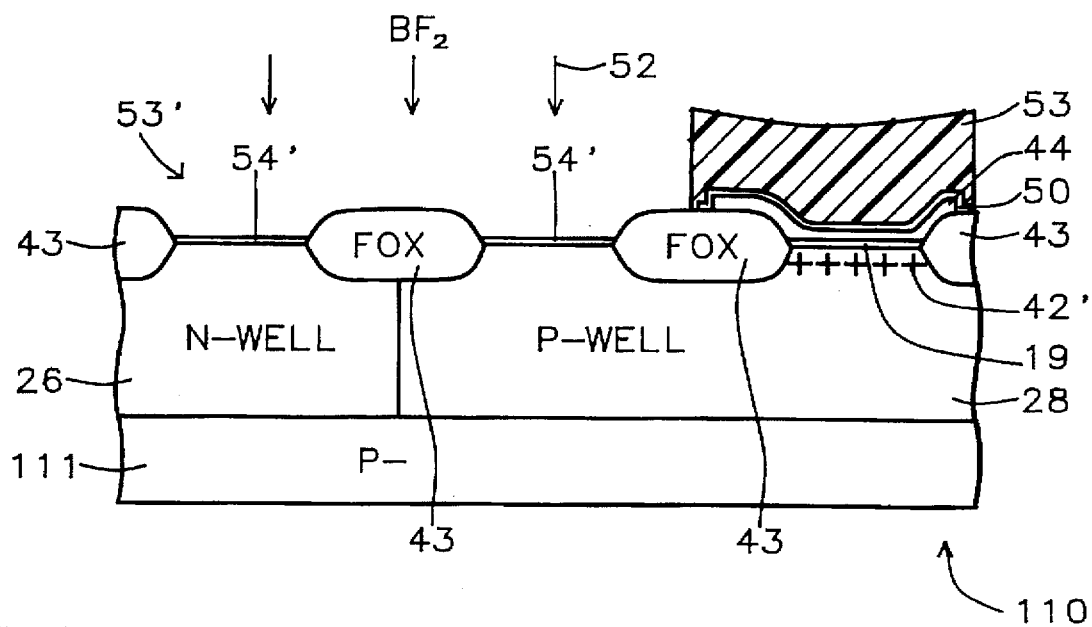
Figure 3M:
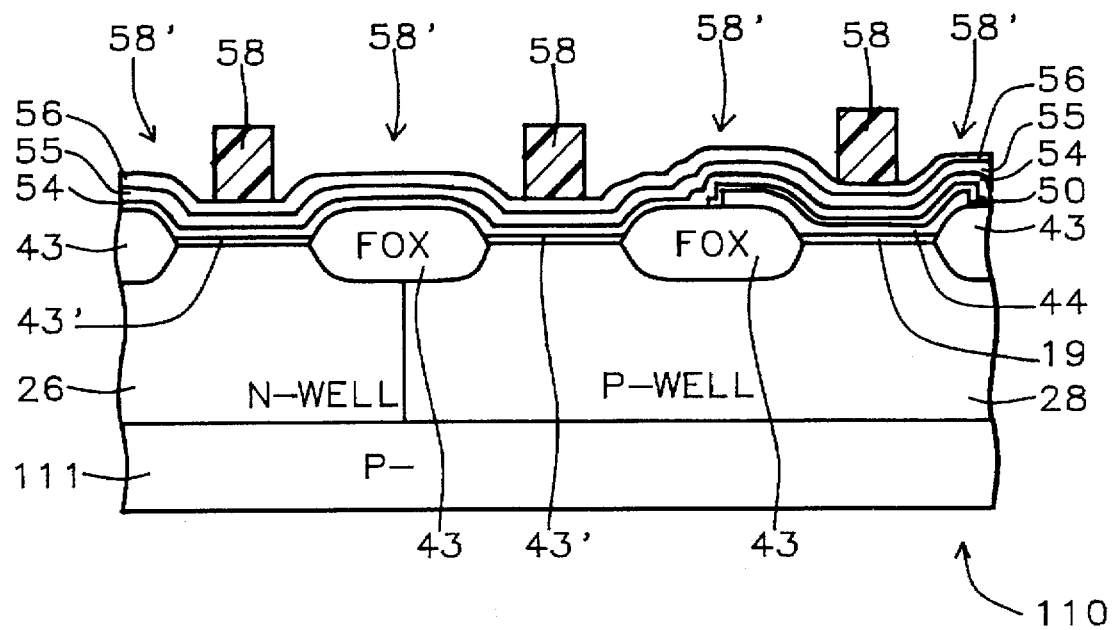
Figure 3N:
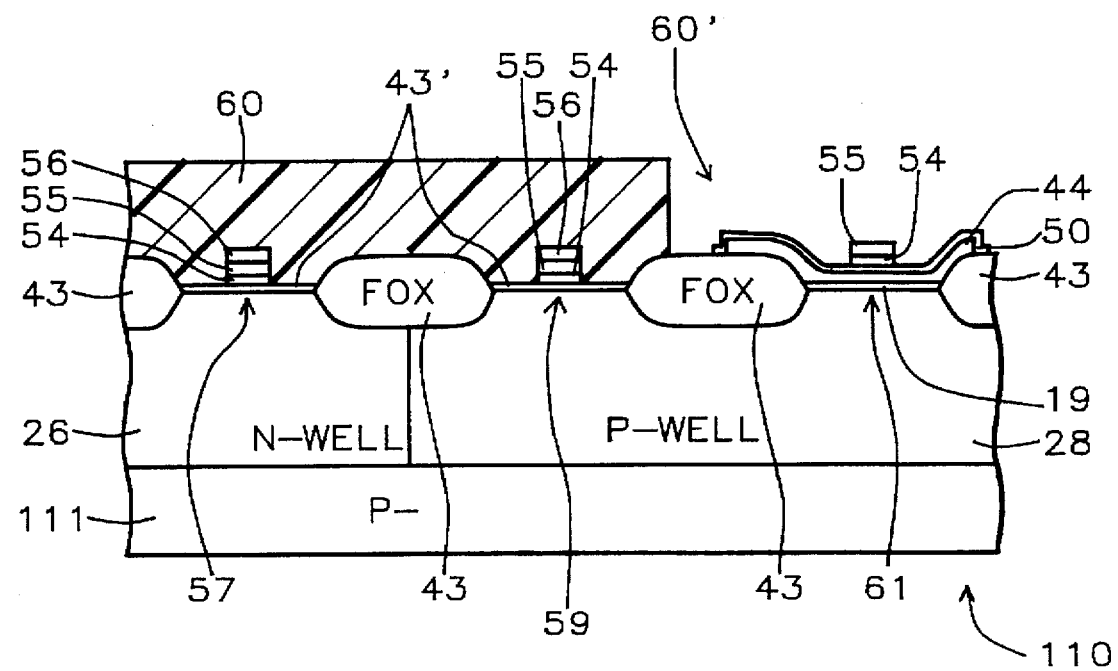
Figure 3O:
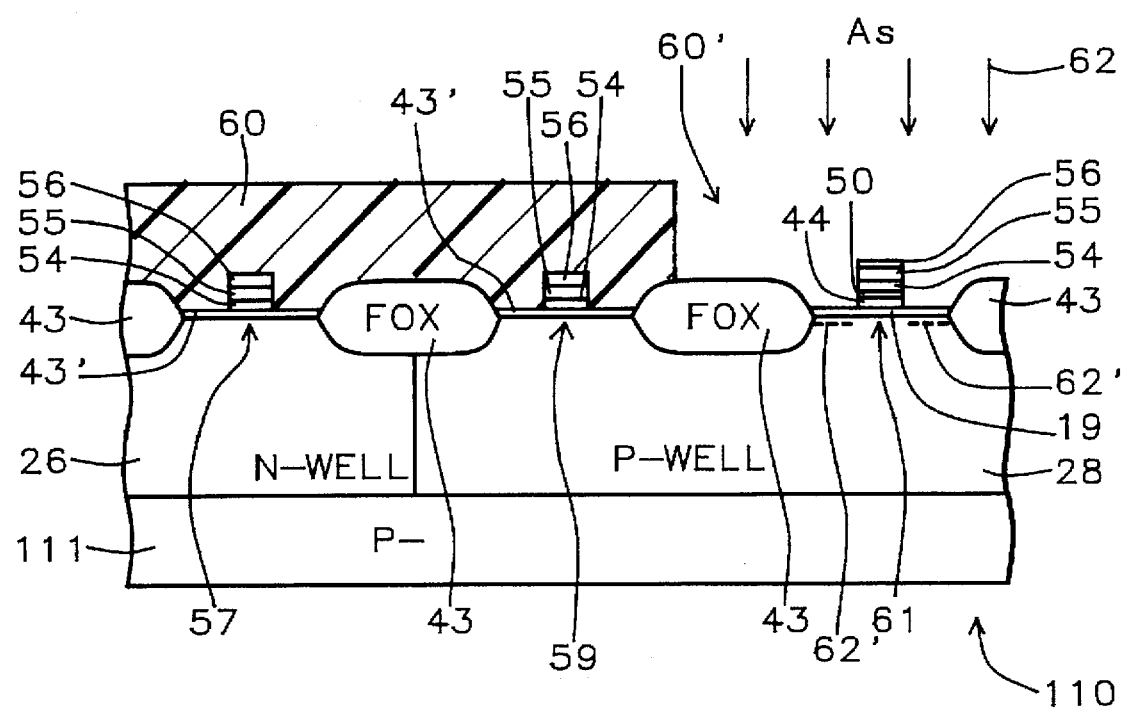
Figure 3P:
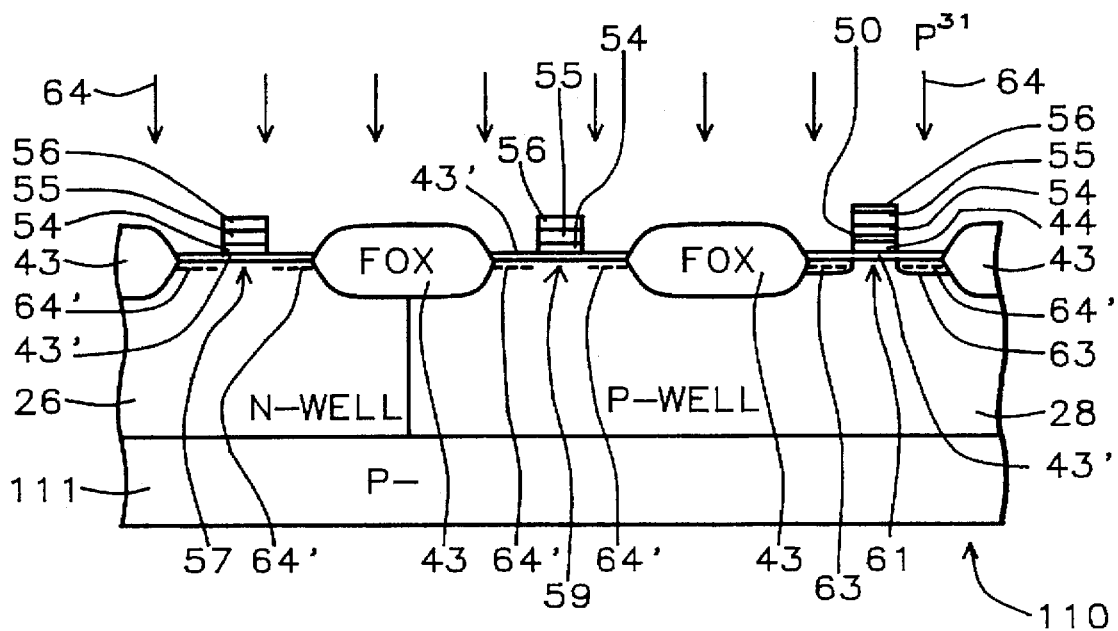
Figure 3Q:
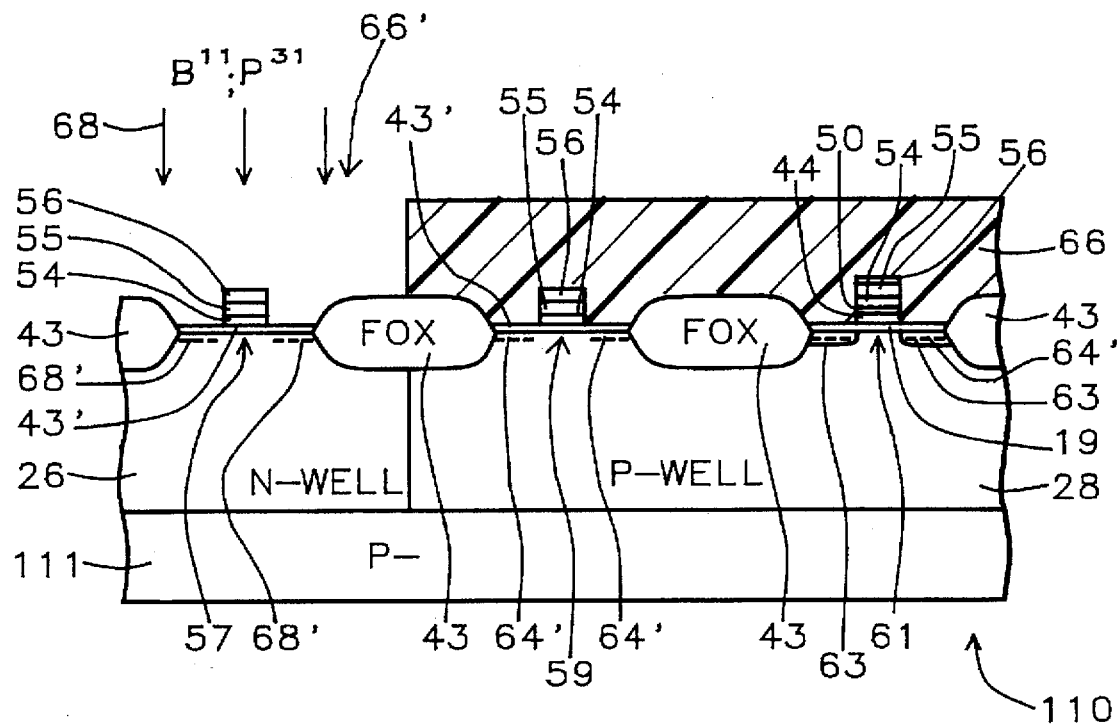
Figure 3R:
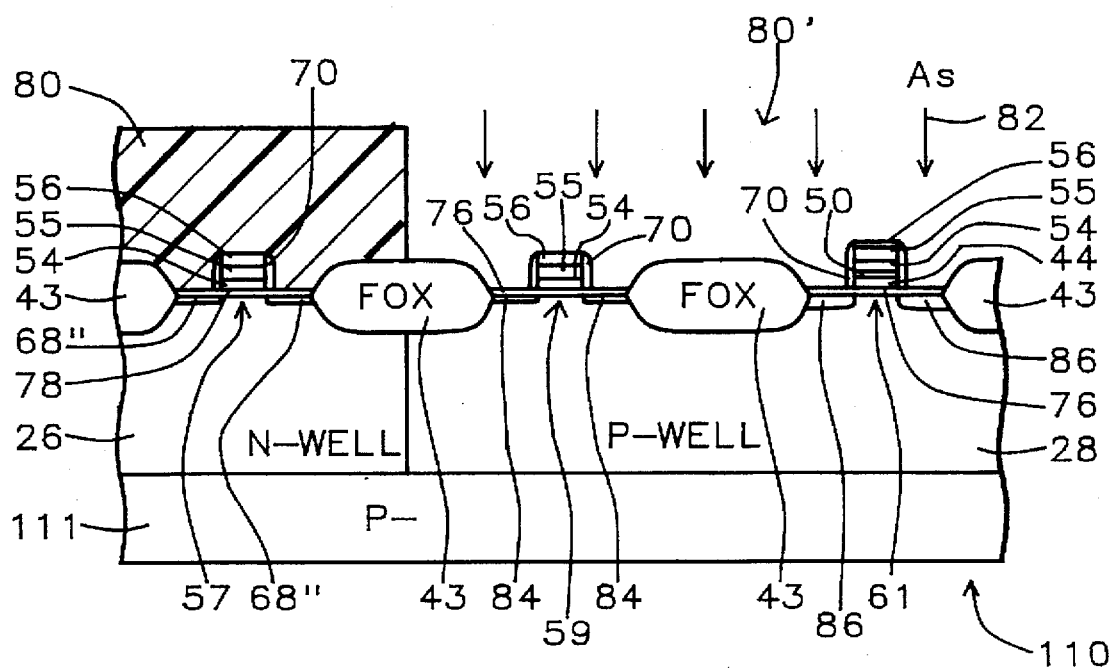
Figure 3S:
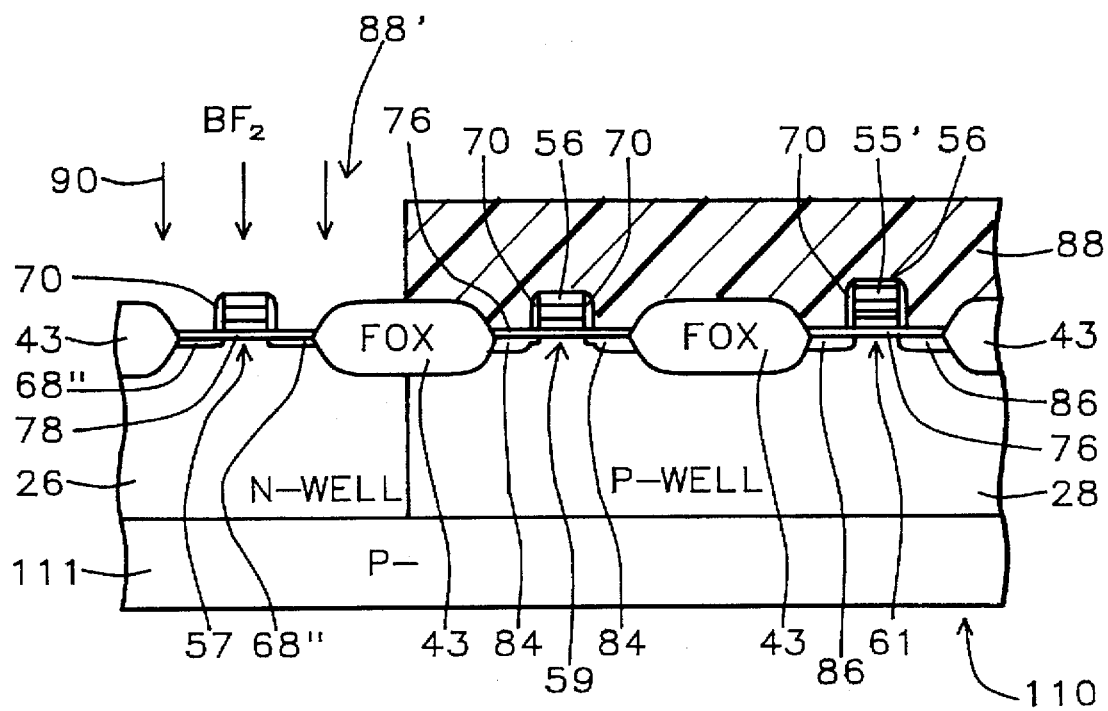
Figure 3T:
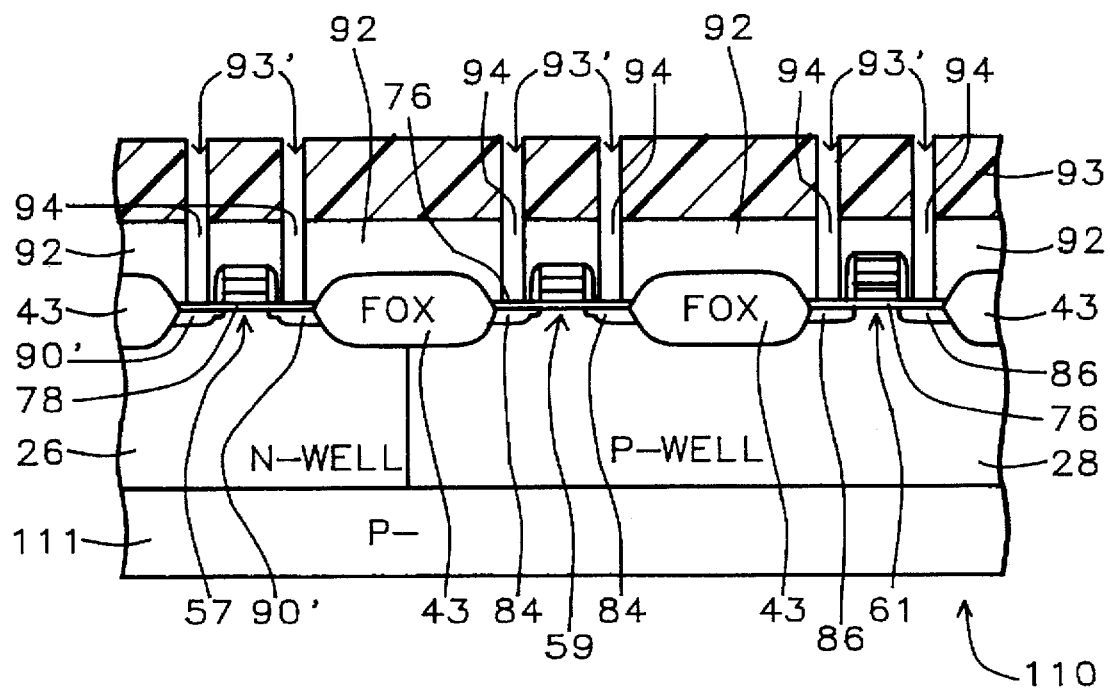
Figure 3U:
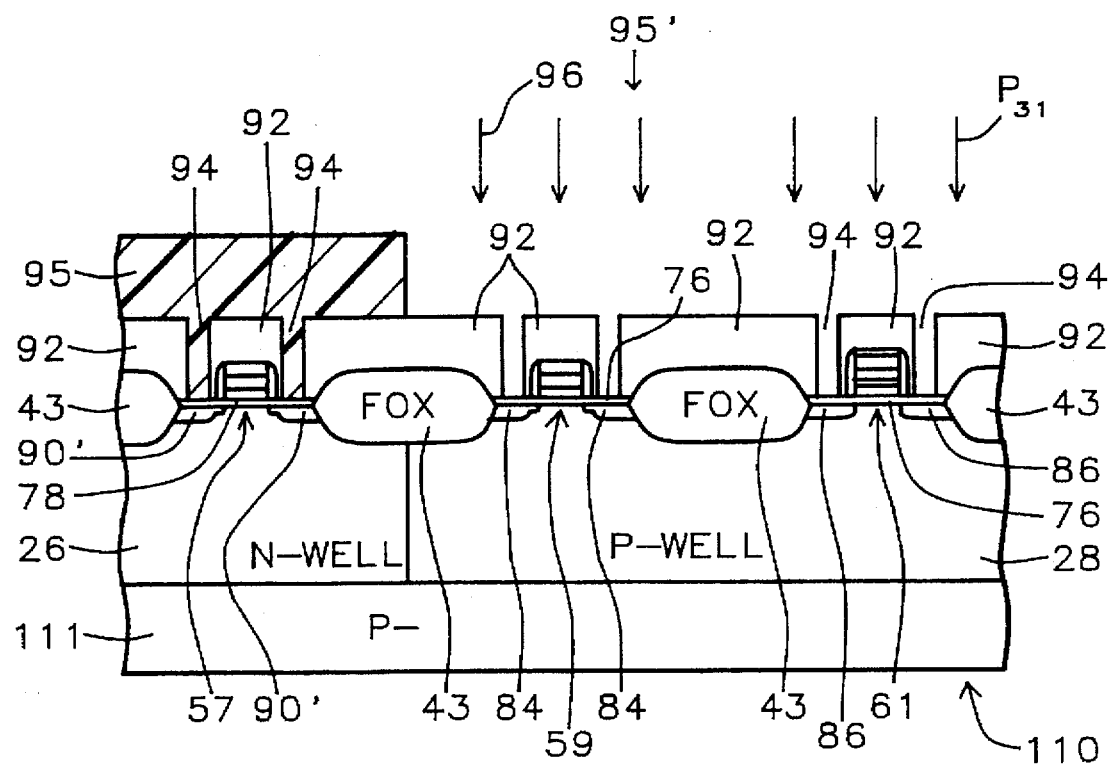
Figure 3V:
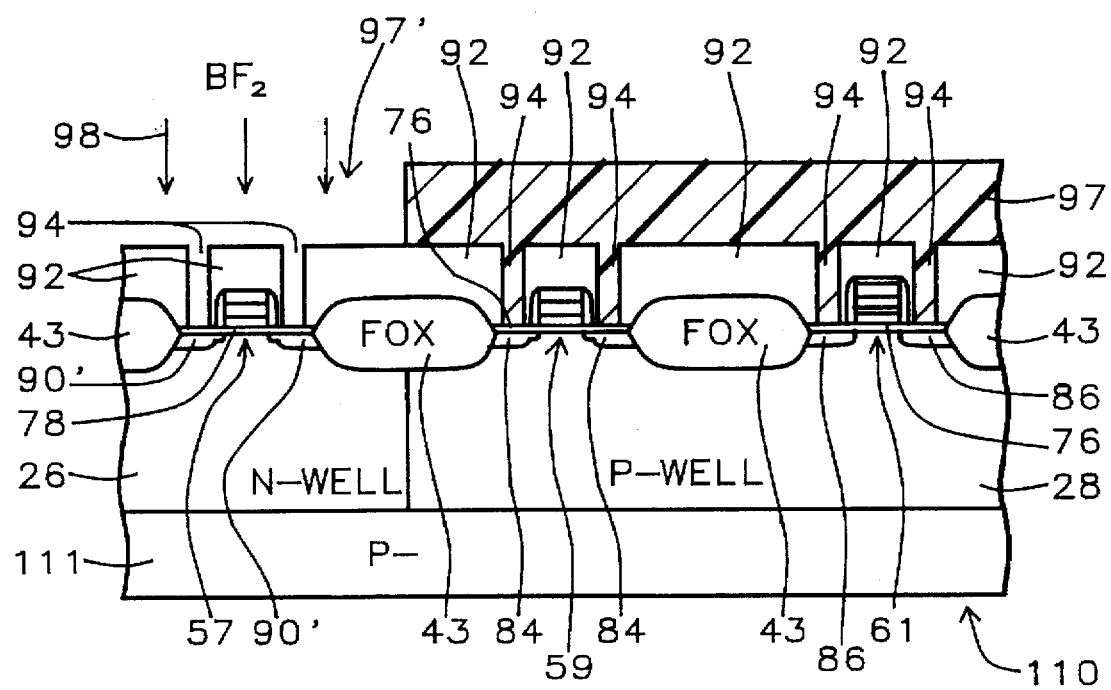
Figure 3W:
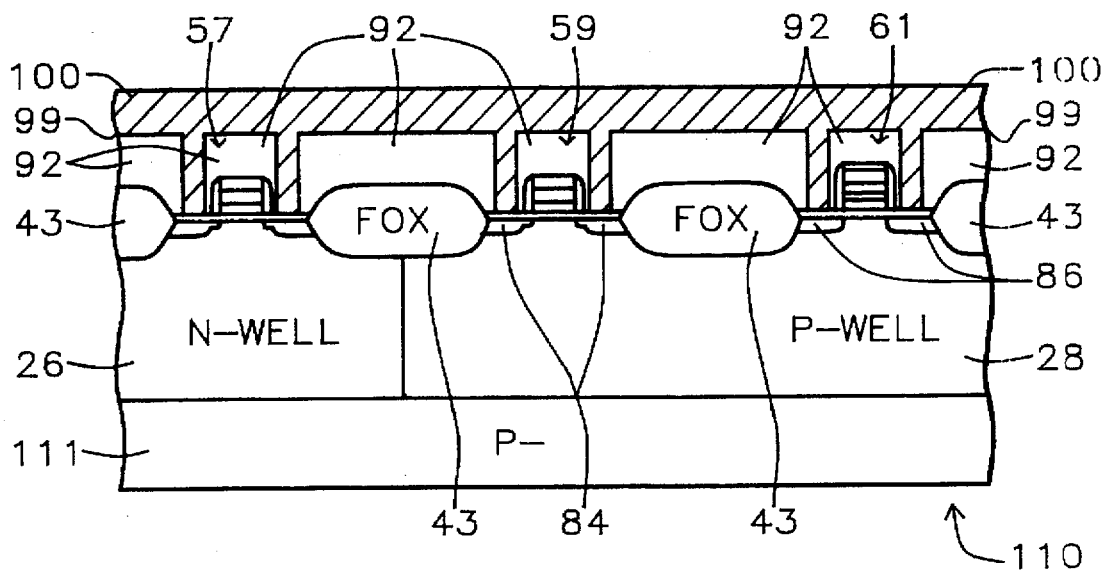
Figure 3X:
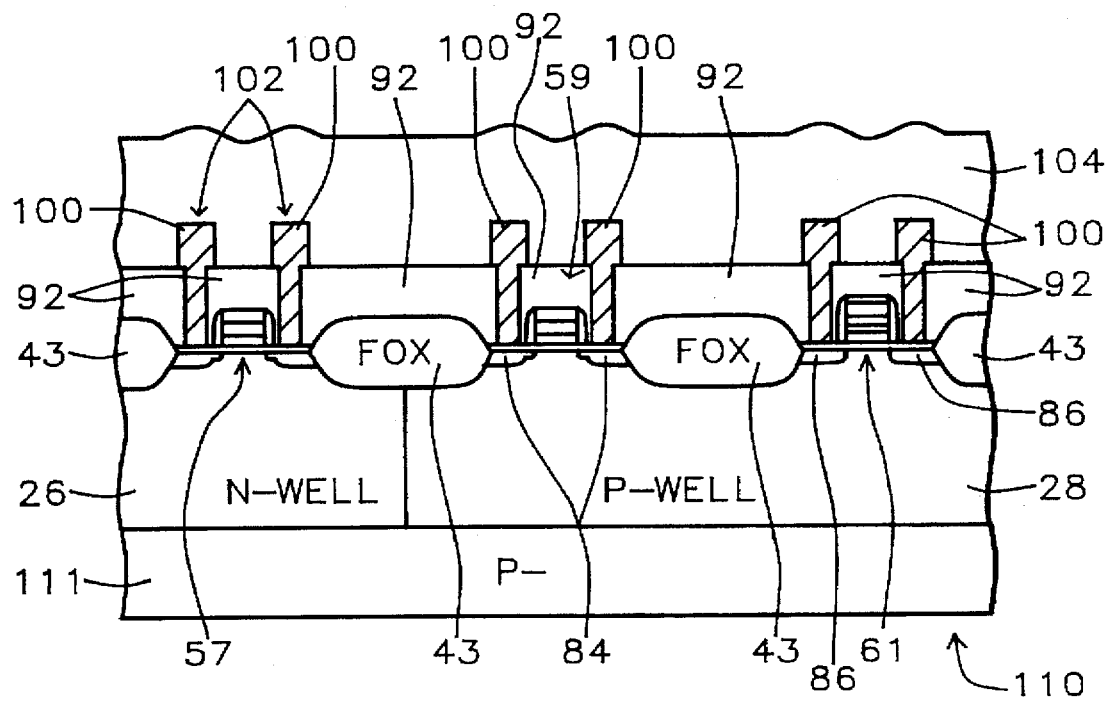

FIGS. 3A–3X show a process flow for an EPROM device 110.

FIG. 3A shows a device 110 including a silicon semiconductor substrate 111 (P100), 15–25 ohm-cm doped with a P-dopant, preferably comprising boron. The device 110 has been oxidized to form a start silicon dioxide layer 12 having a thickness of about 350 Å. A zero layer mask (not shown) has been formed over $SiO_2$ layer 12 followed by a zero layer etch of $SiO_2$ layer 12. The etching process parameters preferably comprise an oxide wet etch followed by a hard bake and then a silicon dry etch of about 1200 Å±200 Å. Then the zero layer mask is stripped. Next, an N-well photoresist mask 14 was been formed over layer 12. Then phosphorus $p^{31}$ dopant ions 16 were ion implanted into N-well region 16'. The mask 14 is then stripped.

In FIG. 3B, the device 110 of FIG. 3A is shown after an P-well photoresist mask 18 was been formed over layer 12. Then boron $B^{11}$ dopant ions 20 were ion implanted into N-well region 20'. The mask 18 is then stripped.

FIG. 3C shows the device of FIG. 3B after a conventional well drive in process forming N-well region 26 from dopant 16' and P-well region 28 from dopant 20' in the surface of substrate 111. The start oxide layer 12 has been removed by BOE (Buffered Oxide Etch). Then a pad oxide (silicon dioxide) layer 32 having a thickness of from about 200 Å to about 300 Å has been formed over the surface of device 110 over well regions 26 and 28. The pad oxidation process is a conventional process.

Next, a silicon nitride layer 34 is deposited over pad oxide layer 32, followed by formation of a photoresist mask 35 with openings 36 therein for patterning silicon nitride layer 34.

FIG. 3D shows the device 110 of FIG. 3C after a dry etch (plasma etch) of silicon nitride layer 34 through openings 36 in mask 35 forming regularly spaced openings 34" in silicon nitride layer to form a silicon nitride mask 34'. Next, mask 36 is stripped from device 110.

Then N– phosphorus ($p^{31}$) dopant 37 is field implanted through openings 34" in silicon nitride mask 34' into regions 37' in N-well region 26 and P-well region 28.

FIG. 3E shows the device 110 of FIG. 3D after the formation of a P– field/deep implant photoresist mask 39 over the device including the silicon nitride mask 34'. Then boron 11 ($B^{11}$) ions 40 are ion implanted to provide P– field implant of boron ions 40' through the openings in mask 39 and through the openings 34" and boron ions 40" through the silicon nitride mask 34'. Then the ($B^{11}$) dopant ions 40' were deeply implanted with the ions 40" implanted less deeply beneath the silicon nitride mask 34' than the ions 40 implanted through the openings 34" in mask 34'.

Next, mask 39 is stripped from device 110.

FIG. 3F shows the device 110 of FIG. 3E after a conventional process of field oxidation has been performed thorough the openings 34" in silicon nitride mask 34' forming regularly spaced field oxide (FOX) regions 43 from the silicon in N-well region 26 and P-well region 28 and from dopant 40' beneath openings 34". Then, the silicon nitride mask 34' is stripped from device 110, exposing the remainder of pad oxide layer 32 which is then removed by means of a conventional process.

Sacrificial oxide layer 43' is formed by oxidation of the exposed surfaces of N-well region 26 and P-well region 28 follows using a conventional process.

Then a $V_t$ cell implant photoresist mask 41 with opening 41' is formed over device 110, with opening 41' over the P-well region 28 leaving its surface exposed between the right hand pair of the regularly spaced FOX regions 43.

Next, boron ($B^{11}$) ions 42 are ion implanted through opening 41' in mask 41 to form $V_t$ cell doped region 42' between the right hand FOX regions 43.

Then mask 41 is stripped from device 110.

FIG. 3G shows the device 110 of FIG. 3F after removal of sacrificial oxide layer 43' is performed in the conventional manner, and formation of first gate oxide layer 19 in place of sacrificial oxide layer 43' by oxidation of the exposed surfaces of N-well region 26 and P-well region 28 using a conventional process.

Then, a first polysilicon layer 44 is deposited over device 110 by a conventional process with a preferred thickness from about 1.5 kÅ to about 2 kÅ.

A first polysilicon layer P-type capacitor implant is performed into first polysilicon layer 44 with a blank (maskless) P type implant of P– boron ions 45 dopant 45' into the entire polysilicon layer 44 with a dose from about $1 \times 10^{14}/cm^2$ to about $3 \times 10^{14}/cm^2$ at an energy from about 30 keV to about 50 keV. The resulting concentration of P dopant in layer 44 is from about $6 \times 10^{18}$ ions/cm³ to about $2 \times 10^{19}$ ions/cm³.

FIG. 3H shows the device 110 of FIG. 3G after a first polysilicon layer N-type capacitor implant photoresist mask 46 with openings 46' is formed upon device 110. Then an N-type capacitor implant is performed into polysilicon layer 44 with an ion implant of N type arsenic or phosphorus ions 47 of N+ dopant through the openings 46' in mask 46 forming N doped regions 47' over the tunnel oxide layer 19. The N+ ions 47 are implanted with a dose from about $1 \times 10^{15}/cm^2$ to about $3 \times 10^{15}/cm^2$ at an energy from about 70 keV to about 100 keV. The resulting concentration of N dopant in layer 47' is from about $6 \times 10^{19}$ ions/cm³ to about $2 \times 10^{20}$ ions/cm³.

FIG. 3I shows the device 110 of FIG. 3H after the mask 46 was stripped from device 110 leaving the P regions 45' over tunnel oxide layer 19 and the N regions 47" over the FOX regions 43 exposed.

FIG. 3J shows the device 110 of FIG. 3I after formation of a photoresist mask 48 which has an opening 48' over polysilicon layer 44 including regions 44' and 44' except between the centers of the right hand pair of FOX regions 43.

Referring to FIG. 3K, the device of 3J is shown after the portions of layer 44 not protected by mask 48 were removed from the device 110 by etching, after which the mask 48 was then stripped from device 110.

Then a blanket inter-gate ONO layer 50 was deposited upon device 110.

Then over ONO layer 50 was formed a photoresist mask 51 with an opening 51'. Mask 50 was formed to protect $V_t$ cell doped region 42' as seen in FIG. 3K.

Portions of ONO layer 50 are exposed through an opening 51' of mask 51 and those exposed portions (which are unprotected) are etched away.

Then exposed portions of first gate oxide layer 19 are removed, where the ONO layer 50 has been removed. Layer 19 is removed by the process of plasma dry etching of 40 Å of Nitride oxide/nitride/poly oxide using a 10:1 BOE dip.

Then mask 51 is stripped from device 110.

FIG. 3L shows the device 110 of FIG. 3K after a second gate oxide layer 54' is formed by oxidation on the newly exposed surfaces of the N-well 26 and P-well 28.

A $V_t$ enhancement implant photoresist mask 53 is formed on substrate 111 with an opening 53' through which ions ($BF_2$) 52 are then implanted to provide $V_t$ enhancement. The ions 52 are implanted through the layer 54' into N-well 26 and P-well 28; and mask 53 is then stripped from device 110.

FIG. 3M shows the device 110 of FIG. 3L after deposition of a second, blanket, polysilicon layer 54 with a preferred thickness from about 2 kÅ to about 2.5 kÅ is then deposited upon the device 11.

The second polysilicon layer 54 is then doped with dopant (not shown) by $POCl_3$ doping.

The second polysilicon layer 54 is then deglazed by treatment with a wet dip of an aqueous hydrofluoric acid solution, preferably in a concentration of 10:1 $H_2O$:HF.

The polycide ($WSi_x$) layer 55 is then deposited upon polysilicon layer 54.

Then a TEOS deposited $SiO_x$ layer 56 is then deposited upon polycide layer 55. A second polysilicon layer photoresist mask 58 is then formed over TEOS $SiO_x$ layer 56.

Then the $SiO_x$ layer 56 and the polycide layer 55 are etched by means of a plasma dry etches through the second polysilicon layer mask 58.

Then mask 58 is stripped from the device 110 leaving stacks comprising device 57 and device 59 of second polysilicon layer 54, polycide ($WSi_x$) layer 55, and TEOS layer 56 plus an EPROM control gate and floating gate stack comprising device 61 formed of first polysilicon layer 44, inter-gate ONO layer 50, second polysilicon layer 54, polycide ($WSi_x$) layer 55, and a TEOS process if employed to deposit a $SiO_x$ layer 56.

FIG. 3N shows the device 110 of FIG. 3M after formation of a "self-aligned" mask 60 with openings 60' (for the cell array only) over the left end of device 110.

FIG. 3O shows the device 110 of FIG. 3N with after a self-aligned etch of TEOS layer 56 from stack 61.

Next, using mask 60 again, an MDD implant of Arsenic ($As^{75}$) ions 62 is made into the source and drain regions 62' adjacent to the EPROM gate 61 EPROM; and then mask 60 is stripped from the device 110.

FIG. 3P shows the device 110 of FIG. 3O regions 63 Polycide ($WSi_x$) layer 55 (upon polysilicon layer 54) is then annealed in a furnace at a temperature of about 900° C.

Next, ($P^{31}$) ions 64 are implanted into all source/drain regions 64', and 63 resulting in N-LDD implanting of dopant 64'. Regions 63 include the dopant 62' from the arsenic implanting shown in FIG. 3O.

FIG. 3Q shows the device 110 of FIG. 3P after formation of P-LDD/Halo Implant photoresist mask 66 with openings 66' and implanting of P-LDD in a halo implant of ($B^{11}$) ions 68. By the halo implant ($B^{11}$) dopant 68' is introduced into N-well 26 adjacent to the stack 57 forming doped regions 68" in N-well 26, shown in FIG. 3R. Then mask 66 is then stripped from device 110.

FIG. 3R shows the device 110 of FIG. 3Q after the LDD deposition of dopant 68' and after TEOS blanket deposition of a spacer layer (not shown for convenience of illustration) to produce spacers 70 is performed by blanket chemical vapor deposition at about 700° C. with a thickness of about 3 kÅ. Next, that spacer layer is subjected to a conventional spacer etch process, which also removes gate oxide layer 19 and layer 43' down to the surface of N-well 26 and P-well 28, leaving spacers 70.

Then, a set of silicon dioxide layers 76 and 78 are formed over P-well 28 and N-well 26 respectively.

Next, a N+ source/drain-implant photoresist mask 80 is formed over the N-well 26 with opening 80' over P-well 28.

Then an N+ ion implant of (As$^{75}$) ions 82 is made into source/drain-forming regions 84 and 86 for stacks 59 and 61 respectively; and mask 80 is stripped from the device 110.

FIG. 3S shows the device 110 of FIG. 3R after formation of photoresist mask 88 opening 88' for a P+ source/drain implant. The implant of BF2 ions 90 is performed into P+ source/drain regions 90' adjacent to EPROM stack 57.

Then mask 88 is stripped from the device 110, followed a source/drain drive in of the ions 90 into regions 68" forming new regions 90' in the place thereof.

FIG. 3T shows the device 110 of FIG. 3S after a blanket conventional BPTEOS process of forming a borophosphosilicate glass (BPSG) dielectric layer 92 over device 110. Layer 92 is deposited with a preferred thickness from about 10 kÅ to about 12 kÅ by CVD deposition.

Then the BPSG layer 92 is heated to from about 850° C. to about 900° C. to cause BPSG layer 92 to flow.

Then BPSG layer 92 is etched back from about 2.5 kÅ to about 3 kÅ because of the planarization issue.

A contact photoresist mask 93 is formed on BPSG layer 92. The mask 93 includes openings 93' down to BPSG layer 92 aligned with doped regions 90', 84 and 86 for formation of electrical contacts is formed on the device 110.

Contact openings 94 are etched in layer 92 down to the doped regions 90', 84 and 86. Then mask 93 is stripped from the device 110.

FIG. 3U shows the device 110 of FIG. 3T with a photoresist mask 95 covering the N-well 26 with an opening 95' over P-well for performing an N+ contact implant with p$^{31}$ ions 96 through openings 94 in layer 92 into silicon dioxide layers 76 and 78 above regions 84 and 86 to form contacts to prevent contact leakage.

Then mask 95 is stripped from the device 110.

FIG. 3V shows the device 110 of FIG. 3U after formation of photoresist mask 97 over P-well 28 for P+ ion implanting dopant to form contacts through opening 97' in mask 97. The P+ contact implant of (BF$_2$) ions 98 through opening 97' mask 97 openings 94 in layer 92 down to layer 78 forming ion implanted contacts; and mask 97 is stripped from device 110.

FIG. 3W shows the device 110 of FIG. 3V after a rapid thermal anneal (RTA) to form the contacts at the base of openings 94 in layer 92.

Then a barrier metal layer 99 (Ti:400 Å/TiN:1,000 Å) with a preferred total thickness from about 1.2 kÅ to about 1.6 kÅ is then deposited upon the entire device 110 in a blanket layer followed by another rapid thermal anneal (RTA) of the metal in barrier layer 99. Finally a W (tungsten) layer 100 with a preferred thickness from about 8 kÅ to about 9 kÅ is then deposited upon the entire device 110 in a blanket layer by CVD deposition covering the barrier layer 99.

FIG. 3X shows the device 110 of FIG. 3W after an etchback of tungsten layer 100, followed by sputtering of metal (AlSiCu) film 102 with a preferred thickness from about 8 kÅ to about 9 kÅ followed by formation of a conventional metal photoresist mask (not shown for convenience of illustration), etching of metal film 102 and stripping of that photoresist mask. Then a passivation layer 104 is deposited on the device 11. A passivation layer mask is formed followed by a passivation etch and the mask is stripped followed by formation of alloy of PEOX at a thickness of about 20 kÅ after a passivation etch or PESi$_3$N$_4$ or a combination of SiO$_x$ and Si$_3$N$_4$.

TABLE I

| | |
|---|---|
| First State | ΔVtf = 0 Volts No Program |
| Second State | ΔVtf = 1.5 Volts Program and Second Erase |
| Third State | ΔVtf = 3.0 Volts Program and First Erase |
| Fourth State | ΔVtf = 6.0 Volts Program without Erase |

TABLE II

| | BIAS | | | | |
|---|---|---|---|---|---|
| Mode | Vg | Vd | Vs | Vb | RESULT |
| PROGRAM Hot e- to floating gate | 12 V | 7 V | 0 V | 0 V | Vtf shift 6 V e- charge will be shared by Cfp and Cfn |
| ERASE | 0 V | FL | 10 V | 0 V | First Erase, Half of Total |
| F-N Tunneling | -7 V | FL | 8 V | 0 V | e- from N type capacitor will be discharged through Source side. |
| | | | | | -Q/2 ΔVtf = 3.0 V remained Second Erase |
| | | | | | -Q/4 ΔVtf = 1.5 V remained Third Erase 0.75 V |
| | | | | | Fourth Erase 0.38 V |
| | | | | | FL-FLOATING VOLTAGE |

APPENDIX $$\Delta Vtf = \frac{Q}{Cfn + Cfp} \quad \text{(Equation 1)}$$

While this invention has been described in terms of the above specific embodiment(s), those skilled in the art will recognize that the invention can be practiced with modifications within the spirit and scope of the appended claims, i.e. that changes can be made in form and detail, without departing from the spirit and scope of the invention. Accordingly all such changes come within the purview of the present invention and the invention encompasses the subject matter of the claims which follow.

Having thus described the invention, what is claimed as new and desirable to be secured by Letters Patent is as follows:

1. A floating gate Erasable Programmable ROM memory device comprising;
    a lightly doped silicon semiconductor substrate having a surface, said substrate being doped with a first type of dopant with a channel region with two ends, and said channel region having a surface and two sides joining said two ends formed in said substrate,
    a doped source region formed in said substrate on one side of said channel region and a doped drain region formed in said substrate on the other side of said of said channel region,
    a tunnel oxide layer formed over said surface of said channel region and field oxide regions formed over said surface of said substrate adjacent to said ends of said channel,
    a floating gate electrode formed from a doped first polysilicon layer formed above said tunnel oxide layer and above said field oxide regions,
    said floating gate electrode including a first capacitor region doped with a type of dopant of an opposite type from said substrate formed above said tunnel oxide layer and said first capacitor region being located above said channel, said floating gate electrode including a second capacitor region doped with an opposite type of dopant from said first capacitor region, said second capacitor region being formed above said field oxide region, said first capacitor region and said second capacitor region forming a PN junction in said floating gate electrode, an integrate electrode dielectric layer covering said floating gate electrode including said first capacitor region and said second capacitor region, a polysilicon control gate electrode formed from a second polysilicon layer located over said integrate electrode dielectric layer, and an additional dielectric layer located over said control gate electrode of said Erasable Programmable ROM memory device.

2. A device in accordance with claim 1 wherein said floating gate ROM device includes:

said substrate and said channel region being P doped, said first capacitor region being an N doped region over said tunnel oxide region, and said second capacitor region being an P doped region over said field oxide region.

3. A device in accordance with claim 2 wherein the concentration of N dopant in said first capacitor region is from about $6 \times 10^{19}$ ions/cm$^3$ to about $2 \times 10^{20}$ ions/cm$^3$, and the concentration of P dopant in said second capacitor region is from about $6 \times 10^{18}$ ions/cm$^3$ to about $2 \times 10^{19}$ ions/cm$^3$.

4. A device in accordance with claim 2 wherein:

said substrate comprises a P-doped silicon semiconductor, said first capacitor region is doped with an N type dopant selected from the group consisting of arsenic and phosphorus, formed in said first polysilicon layer over the tunnel oxide layer, with a concentration of N dopant in said first polysilicon layer from about $6 \times 10^{19}$ ions/cm$^3$ to about $2 \times 10^{20}$ ions/cm$^3$, and said second capacitor region is doped with a P type dopant comprising boron formed in said first polysilicon layer with a concentration of P dopant from about $6 \times 10^{18}$ ions/cm$^3$ to about $2 \times 10^{19}$ ions/cm$^3$.

5. A device in accordance with claim 2 wherein the PN junction comprises:

said first capacitor region formed in said first polysilicon layer comprising an N-type region formed in a portion of said first polysilicon layer of ion implanted with N type ions selected from the group consisting of arsenic ions and phosphorus ions, said N type dopant implanted with a concentration from about $6 \times 10^{19}$ ions/cm$^3$ to about $2 \times 10^{20}$ ions/cm$^3$, and a second capacitor region formed in said first polysilicon layer comprising a P-type capacitor implant in said first polysilicon layer P– boron dopant in said first polysilicon layer with a concentration from about $6 \times 10^{18}$ ions/cm$^3$ to about $2 \times 10^{19}$ ions/cm$^3$.

6. A device in accordance with claim 1 wherein in said first capacitor region the concentration of N dopant is from about $6 \times 10^{19}$ ions/cm$^3$ to about $2 \times 10^{20}$ ions/cm$^3$, and in said second capacitor region the concentration of P dopant is from about $6 \times 10^{18}$ ions/cm$^3$ to about $2 \times 10^{19}$ ions/cm$^3$.

7. A device in accordance with claim 1 wherein in said first capacitor region the concentration of N dopant is from about $6 \times 10^{19}$ ions/cm$^3$ to about $2 \times 10^{20}$ ions/cm$^3$ ion implanted N type dopant selected from the group consisting of arsenic and phosphorus ions forming N+ doped regions, and in said second capacitor region the concentration is from about $6 \times 10^{18}$ ions/cm$^3$ to about $2 \times 10^{19}$ ions/cm$^3$ of ion implanted P type boron dopant.

8. A floating gate ROM device in accordance with claim 1 wherein said first polysilicon layer has a thickness from about 1.5 kÅ to about 2 kÅ.

9. A floating gate ROM device in accordance with claim 2 wherein said first polysilicon layer has a thickness from about 1.5 kÅ to about 2 kÅ.

10. A floating gate ROM device in accordance with claim 3 wherein said first polysilicon layer has a thickness from about 1.5 kÅ to about 2 kÅ.

11. A floating gate ROM device in accordance with claim 5 wherein said first polysilicon layer has a thickness from about 1.5 kÅ to about 2 kÅ.

12. A floating gate ROM device in accordance with claim 7 wherein said first polysilicon layer has a thickness from about 1.5 kÅ to about 2 kÅ.

13. A floating gate Erasable Programmable ROM device in accordance with claim 2 wherein in the program mode the voltages are as follows:
$V_g = 12V$
$V_d = 7V$
$V_s = 0V$
$V_b = 0V$ in the erase mode the voltages are as follows:
$V_g = 0V$
$V_d = FL$
$V_s = 10V$
$V_b = 0V$ in the erase mode the Fowler-Nordheim voltages are as follows:
$V_g = -7V$
$V_d = FL$
$V_s = 8V$
$V_b = 0V$ where
$V_g$ is the control gate voltage,
$V_d$ is applied drain region voltage,
$V_s$ is the applied source voltage and
$V_b$ is the applied substrate voltage.

14. A floating gate ROM device in accordance with claim 7 wherein said first polysilicon layer has a thickness from about 1.5 kÅ to about 2 kÅ, and said second polysilicon layer has a thickness from about 2 kÅ to about 2.5 kÅ.

15. A floating gate Erasable Programmable ROM device comprising:

a lightly doped P– semiconductor substrate having a surface, a doped source region and a doped drain region formed in said substrate, and a tunnel oxide layer and field oxide regions formed over said surface of said substrate, a PN junction floating gate electrode formed from a first polysilicon layer comprising doped polysilicon with an N doped capacitor region formed above said tunnel oxide layer and said floating gate electrode including at least one P doped capacitor region above a said field oxide region juxtaposed with said N doped capacitor region to form a PN junction, an interpolysilicon ONO dielectric layer covering said PN floating gate electrode, a polysilicon control gate electrode formed from a second polysilicon layer located over said ONO dielectric layer, an additional dielectric layer over said control gate electrode with a via opening down to said drain region, and an electrical conductor over said additional dielectric layer extending down into said via opening into contact with said drain region of said Erasable Programmable ROM memory device.

16. A floating gate Erasable Programmable ROM device in accordance with claim 15 comprising:

an applied control gate voltage $V_g$ is connected to a first node $N_1$ connected to said control electrode, said first node connected through a capacitor $C_{fn}$ N type floating gate capacitor to a second node $N_2$ comprising said N doped region of said floating gate electrode which is connected through a capacitor $C_{gd}$ for coupling said floating gate drain region to said drain region, said drain region being connected to an applied drain region voltage $V_d$, said node $N_2$ being connected through a capacitor $C_{gb}$ between said substrate and said floating gate capacitor to $V_b$ applied substrate voltage and through a capacitor $C_{gs}$ between said source and said floating gate to a $V_s$ applied source voltage, and said node $N_1$ being connected through capacitor $C_{fp}$ comprising a P type floating gate capacitance to a node $N_3$, said node $N_3$ being connected to said node $N_2$ through a PN diode formed in said floating gate and node $N_3$ is also connected to node $N_2$ through a capacitor $C_j$.

17. A floating gate Erasable Programmable ROM device in accordance with claim 16 wherein in the program mode the voltages are as follows:
$V_g=12V$
$V_d=7V$
$V_s=0V$
$V_b=0V$ in the erase mode the voltages are as follows:
$V_g=0V$
$V_d=FL$
$V_s=10V$
$V_b=0V$ in the erase mode the Fowler-Nordheim voltages are as follows:
$V_g=-7V$
$V_d=FL$
$V_s=8V$
$V_b=0V$ where
$V_g$ is the control gate voltage,
$V_d$ is applied drain region voltage,
$V_s$ is the applied source voltage and
$V_b$ is the applied substrate voltage.

* * * * *